United States Patent
Hata et al.

(10) Patent No.: US 7,273,089 B2
(45) Date of Patent: Sep. 25, 2007

(54) ELECTRONIC APPARATUS HAVING A HEAT-RADIATING UNIT FOR RADIATING HEAT OF HEAT-GENERATING COMPONENTS

(75) Inventors: Yukihiko Hata, Hamura (JP); Kentaro Tomioka, Sayama (JP); Mitsuyoshi Tanimoto, Sagamihara (JP); Hiroyuki Kusaka, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 10/854,311

(22) Filed: May 26, 2004

(65) Prior Publication Data

US 2005/0007739 A1 Jan. 13, 2005

(30) Foreign Application Priority Data

May 26, 2003 (JP) ............................. 2003-147805

(51) Int. Cl.
*F28D 15/00* (2006.01)
*H05K 7/20* (2006.01)

(52) U.S. Cl. ................................ 165/104.33; 165/80.4; 361/699

(58) Field of Classification Search ........... 165/104.33, 165/104.21, 185, 80.3–80.4, 104.34; 361/687, 361/699, 700, 704, 698; 257/714–716
See application file for complete search history.

(56) References Cited

U.S. PATENT DOCUMENTS

| | | | |
|---|---|---|---|
| 4,712,159 A | 12/1987 | Clemens | |
| 4,980,848 A * | 12/1990 | Griffin et al. | 361/687 |
| 5,089,936 A | 2/1992 | Kojima et al. | |
| 5,168,926 A | 12/1992 | Watson | |
| 5,229,757 A * | 7/1993 | Takamiya et al. | 345/168 |
| 5,255,154 A * | 10/1993 | Hosoi et al. | 361/681 |
| 5,268,817 A | 12/1993 | Miyagawa et al. | |
| 5,383,138 A * | 1/1995 | Motoyama et al. | 361/683 |
| 5,383,340 A * | 1/1995 | Larson et al. | 62/259.2 |
| 5,494,447 A * | 2/1996 | Zaidan | 439/31 |
| 5,594,619 A | 1/1997 | Niyagawa et al. | |
| 5,606,341 A * | 2/1997 | Aguilera | 345/87 |
| 5,612,852 A * | 3/1997 | Leverault et al. | 361/687 |
| 5,634,351 A * | 6/1997 | Larson et al. | 62/259.2 |
| 5,648,889 A | 7/1997 | Bosli | |
| 5,729,429 A * | 3/1998 | Margaritis et al. | 361/680 |
| 5,731,952 A | 3/1998 | Ohgami et al. | |
| 5,770,478 A | 6/1998 | Iruvanti et al. | |
| 5,901,035 A | 5/1999 | Foster et al. | |

(Continued)

FOREIGN PATENT DOCUMENTS

JP         7-142886         6/1995

(Continued)

*Primary Examiner*—Tho Duong
(74) *Attorney, Agent, or Firm*—Blakely Sokoloff Taylor & Zafman, LLP (57) ABSTRACT

According to one embodiment of the invention, an electronic apparatus comprises a main unit, a display unit and a support unit. The main unit contains a heat-generating component and a heat-receiving portion. The heat-receiving portion is thermally connected to the heat-generating component. The support unit supports the display unit on the main unit and contains a heat-radiating portion that radiates the heat of the heat-generating component. The heat of the heat-generating component is transmitted to a heat-transferring medium and transferred to the heat-radiating portion through the heat-transferring medium.

9 Claims, 11 Drawing Sheets

U.S. PATENT DOCUMENTS

| | | | |
|---|---|---|---|
| 5,953,052 A * | 9/1999 | McNelley et al. | 348/14.16 |
| 6,005,767 A | 12/1999 | Ku et al. | |
| 6,026,888 A * | 2/2000 | Moore | 165/80.3 |
| 6,049,459 A | 4/2000 | Edmonds et al. | |
| 6,104,451 A * | 8/2000 | Matsuoka et al. | 349/58 |
| 6,141,214 A | 10/2000 | Ahn | |
| 6,148,906 A * | 11/2000 | Li et al. | 165/104.33 |
| 6,166,907 A | 12/2000 | Chien | |
| 6,196,850 B1 | 3/2001 | Dietz et al. | |
| 6,231,371 B1 | 5/2001 | Helot | |
| 6,243,261 B1 * | 6/2001 | Janik et al. | 361/687 |
| 6,266,241 B1 * | 7/2001 | Van Brocklin et al. | 261/687 |
| 6,282,082 B1 | 8/2001 | Armitage et al. | |
| 6,288,896 B1 * | 9/2001 | Hsu | 361/687 |
| 6,296,048 B1 | 10/2001 | Sauer | |
| 6,313,990 B1 | 11/2001 | Cheon | |
| 6,327,145 B1 | 12/2001 | Lian et al. | |
| 6,333,847 B1 | 12/2001 | Katsui et al. | |
| 6,341,061 B1 * | 1/2002 | Eisbach et al. | 361/687 |
| 6,353,529 B1 * | 3/2002 | Cies | 361/681 |
| 6,377,452 B1 | 4/2002 | Sasaki et al. | |
| 6,396,687 B1 | 5/2002 | Sun et al. | |
| 6,408,937 B1 | 6/2002 | Roy | |
| 6,418,017 B1 | 7/2002 | Patel et al. | |
| 6,430,038 B1 | 8/2002 | Helot et al. | |
| 6,437,973 B1 | 8/2002 | Helot et al. | |
| 6,464,195 B1 | 10/2002 | Hildebrandt | |
| 6,473,296 B2 | 10/2002 | Amemiya et al. | |
| 6,477,871 B1 | 11/2002 | Shaw et al. | |
| 6,483,445 B1 | 11/2002 | England | |
| 6,487,076 B1 * | 11/2002 | Wang | 361/697 |
| 6,519,143 B1 | 2/2003 | Goko | |
| 6,519,147 B2 | 2/2003 | Nakagawa et al. | |
| 6,519,148 B2 | 2/2003 | Nakagawa et al. | |
| 6,532,152 B1 | 3/2003 | White et al. | |
| 6,556,439 B2 * | 4/2003 | Shibasaki | 361/687 |
| 6,570,764 B2 | 5/2003 | Bhatia et al. | |
| 6,594,149 B2 | 7/2003 | Yamada et al. | |
| 6,625,022 B2 | 9/2003 | Frustchy et al. | |
| 6,625,024 B2 | 9/2003 | Mermet-Guyennet | |
| 6,652,223 B1 | 11/2003 | Horng et al. | |
| 6,654,234 B2 * | 11/2003 | Landry et al. | 361/681 |
| 6,656,770 B2 | 12/2003 | Atwood et al. | |
| 6,668,911 B2 | 12/2003 | Bingler | |
| 6,702,007 B1 | 3/2004 | Pan et al. | |
| 6,717,798 B2 | 4/2004 | Bell et al. | |
| 6,728,102 B2 | 4/2004 | Ishikawa et al. | |
| 6,741,465 B2 | 5/2004 | Holalkere et al. | |
| 6,741,470 B2 | 5/2004 | Isenburg | |
| 6,752,204 B2 | 6/2004 | Dishongh et al. | |
| 6,755,626 B2 | 6/2004 | Komatsu et al. | |
| 6,757,170 B2 | 6/2004 | Lee et al. | |
| 6,768,637 B1 | 7/2004 | Amemiya | |
| 6,774,870 B2 | 8/2004 | Mead, Jr. et al. | |
| 6,779,894 B2 | 8/2004 | Shiraishi et al. | |
| 6,785,128 B1 | 8/2004 | Yun | |
| 6,804,115 B2 | 10/2004 | Lai | |
| 6,808,371 B2 | 10/2004 | Niwatsukino et al. | |
| 6,809,927 B2 * | 10/2004 | Ohashi et al. | 361/699 |
| 6,809,930 B2 | 10/2004 | Mueller et al. | |
| 6,825,415 B1 * | 11/2004 | Chen et al. | 174/63 |
| 6,829,139 B1 | 12/2004 | Duarte | |
| 6,831,836 B2 | 12/2004 | Bhatia et al. | |
| 6,833,992 B2 * | 12/2004 | Kusaka et al. | 361/699 |
| 6,839,234 B2 | 1/2005 | Niwatsukino et al. | |
| 6,845,011 B2 * | 1/2005 | Tomioka et al. | 361/699 |
| 6,856,506 B2 | 2/2005 | Doherty et al. | |
| 6,870,736 B2 | 3/2005 | Lee et al. | |
| 6,873,521 B2 | 3/2005 | Landry et al. | |
| 6,894,899 B2 | 5/2005 | Wu et al. | |
| 6,912,120 B2 * | 6/2005 | Kim et al. | 361/681 |
| 6,924,978 B2 | 8/2005 | DiStefano | |
| 6,927,978 B2 | 8/2005 | Arai et al. | |
| 6,983,789 B2 | 1/2006 | Jenkins et al. | |
| 7,016,195 B2 | 3/2006 | Ito et al. | |
| 7,054,158 B2 | 5/2006 | Kimmich | |
| 7,079,394 B2 * | 7/2006 | Mok | 361/700 |
| 2002/0018337 A1 | 2/2002 | Nakamura | |
| 2002/0053421 A1 | 5/2002 | Hisano et al. | |
| 2002/0141159 A1 | 10/2002 | Bloemen | |
| 2003/0039097 A1 | 2/2003 | Igarashi | |
| 2003/0142474 A1 | 7/2003 | Karidis et al. | |
| 2003/0214786 A1 | 11/2003 | Niwatsukino et al. | |
| 2003/0227739 A1 * | 12/2003 | Kim et al. | 361/681 |
| 2004/0001310 A1 * | 1/2004 | Chu et al. | 361/687 |
| 2004/0027800 A1 | 2/2004 | Tanimoto et al. | |
| 2004/0042171 A1 * | 3/2004 | Takamatsu et al. | 361/687 |
| 2004/0042176 A1 | 3/2004 | Niwatsukino et al. | |
| 2004/0057197 A1 | 3/2004 | Hill et al. | |
| 2004/0070942 A1 * | 4/2004 | Tomioka et al. | 361/700 |
| 2004/0012566 A1 | 7/2004 | Lee et al. | |
| 2005/0117298 A1 | 6/2005 | Koga et al. | |
| 2005/0162832 A1 * | 7/2005 | Muller et al. | 361/699 |

FOREIGN PATENT DOCUMENTS

| | | |
|---|---|---|
| JP | 11-039058 | 2/1999 |
| JP | 2001-51079 | 9/2001 |
| JP | 2002-009356 | 4/2002 |
| JP | 2002151638 | 5/2002 |
| JP | 2002-344186 | 11/2002 |
| JP | 3431024 | 7/2003 |
| JP | 2003-233441 | 8/2003 |
| JP | 3452059 | 9/2003 |
| JP | 2004-047921 | 2/2004 |

\* cited by examiner

ELECTRONIC APPARATUS HAVING A HEAT-RADIATING UNIT FOR RADIATING HEAT OF HEAT-GENERATING COMPONENTS

CROSS-REFERENCE TO RELATED APPLICATIONS

This application is based upon and claims the benefit of priority from prior Japanese Patent Application No. 2003-147805, filed May 26, 2003, the entire contents of which are incorporated herein by reference.

BACKGROUND

1. Field

The present invention relates to an electronic apparatus having heat-generating components such as a semiconductor package and a chip set. Particularly, the invention relates to a structure that cools heat-generating components.

2. Description of the Related Art

A CPU is incorporated in, for example, notebook-type portable computers. The heat that the CPU generates while operating increases as its data-processing speed rises or as it performs more and more functions. The higher the temperature of the CPU, the less efficiently it operates. To cool the CPU, so-called "cooling system of liquid cooling type" have been developed in recent years. The cooling system uses a liquid coolant having a larger thermal conductivity constant than air.

Jpn. Pat. Appln. KOKAI Publication No. 7-142886 discloses a cooling system of liquid cooling type, configured for use in portable computers that comprises a main unit and a display unit. The cooling system comprises a heat-receiving header, heat-radiating header, and two tubes. The heat-receiving header is provided in the main unit and thermally connected to the CPU incorporated in the main unit. The heat-radiating header is provided in the display unit or in the main unit along with the heat-receiving header. If the heat-radiating header is provided in the display unit, the heat-radiating header lies adjacent to the display device incorporated in the display unit. Both tubes extend from the main unit to the display unit to circulate the liquid coolant between the heat-receiving header and the heat-radiating header.

In this cooling system, the liquid coolant absorbs the heat of the CPU in the heat-receiving header. In other words, the liquid coolant is heated in the heat-receiving header. The heated liquid coolant is supplied to the heat-radiating header via the first tube. As the coolant passes through the heat-radiating header, it releases the heat of the CPU. That is, the liquid coolant is cooled in the heat-radiating header. The cooled coolant is supplied back to the heat-receiving header via the second tube and absorbs the heat of the CPU. As the liquid coolant circulates, heat is transferred from the CPU to the heat-radiating header, which radiates the heat. Thus, the heat is released from the display unit or the main unit.

If the heat-radiating header that radiates the heat of the CPU is provided in the display unit, the heat-radiating header is adjacent to the display device incorporated in the display unit. The heat emanating from the heat-radiating header inevitably heats the display device. Consequently, the temperature of the display device may rise above the maximum use temperature. If this happens, the images that display device displays will be degraded in quality.

The heat-radiating header may be provided in the main unit. If this is the case, the heat emanating from the heat-radiating header accumulates in the main unit. When the temperature in the main unit rises, the circuit components and the disk drive, which are provided in the main unit, will be heated to high temperatures. The temperature of the circuit components, for example, may rise above their maximum thermal threshold. If this occurs, the circuit components may be degraded in performance or may undergo thermal breakdown.

U.S. Pat. No. 6,519,147 discloses a liquid-cooling system for use in portable computers having a body part and a display part. The cooling system comprises a heat-receiving head and a tube. The heat-receiving head is incorporated in the body part of the computer and connected to heat-generating components such as a CPU and a chip set. The tube is filled with liquid coolant and connected to the heat-receiving head. The tube extending between the body part and the display part.

The display part has a liquid crystal display panel and a housing containing the panel. The tube extends into the housing and lies in the gap between the liquid crystal display panel and the back of the housing. The tube meanders on the back of the housing, thus contacting the housing.

In this liquid-cooling system, the liquid coolant is heated as heat exchange is performed in the heat-receiving head. The liquid coolant heated flows in the tube toward the display part. As the liquid coolant flows through the tube, it transmits the heat of the heat-generating components to the housing. Therefore, the heat diffuses in the housing and is radiated from the entire back of the housing.

In the cooling systems, the liquid coolant heated in the heat-receiving header is led into the tube, raising the surface temperature of the tube. The tube is made of material having high heat-radiating property because it transmits the heat of the liquid coolant to the housing. The liquid crystal panel is liable to the heat emanating from the tube. When the panel is heated to high temperatures, the liquid crystal molecules cannot be oriented as is desired. In consequence, the images that the liquid crystal panel displays will be degraded in quality.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION

An embodiment of this invention will be described, with reference to FIGS. 1 to 14.

FIGS. 1-7 illustrate a portable computer 1, or an electronic apparatus according to the present invention. The portable computer 1 comprises a main unit 2 and a display unit 3. The main unit 2 has a first housing 4 that is shaped like a flat box. The first housing 4 supports a keyboard 5. The front half of the upper surface of the first housing 4 is a palm rest 6, on which the user of the computer 1 may place his or her palms while operating the keyboard 5.

The rear edge of the first housing 4 has a coupling seat 7. The coupling seat 7 extends in the widthwise direction of the first housing 4 and protrudes upwards to a level higher than the upper surface of the first housing 4 and the keyboard 5. Three hollow projections 8a, 8b and 8c are formed integral with the coupling seat 7. The first hollow projection 8a projects upwards from one end of the seat 7. The second hollow projection 8b projects upwards from the other end of the seat 7. The third hollow projection 8c projects upwards from the middle part of the seat 7 and is located between the first and second hollow projections 8a and 8b.

Figure 1:
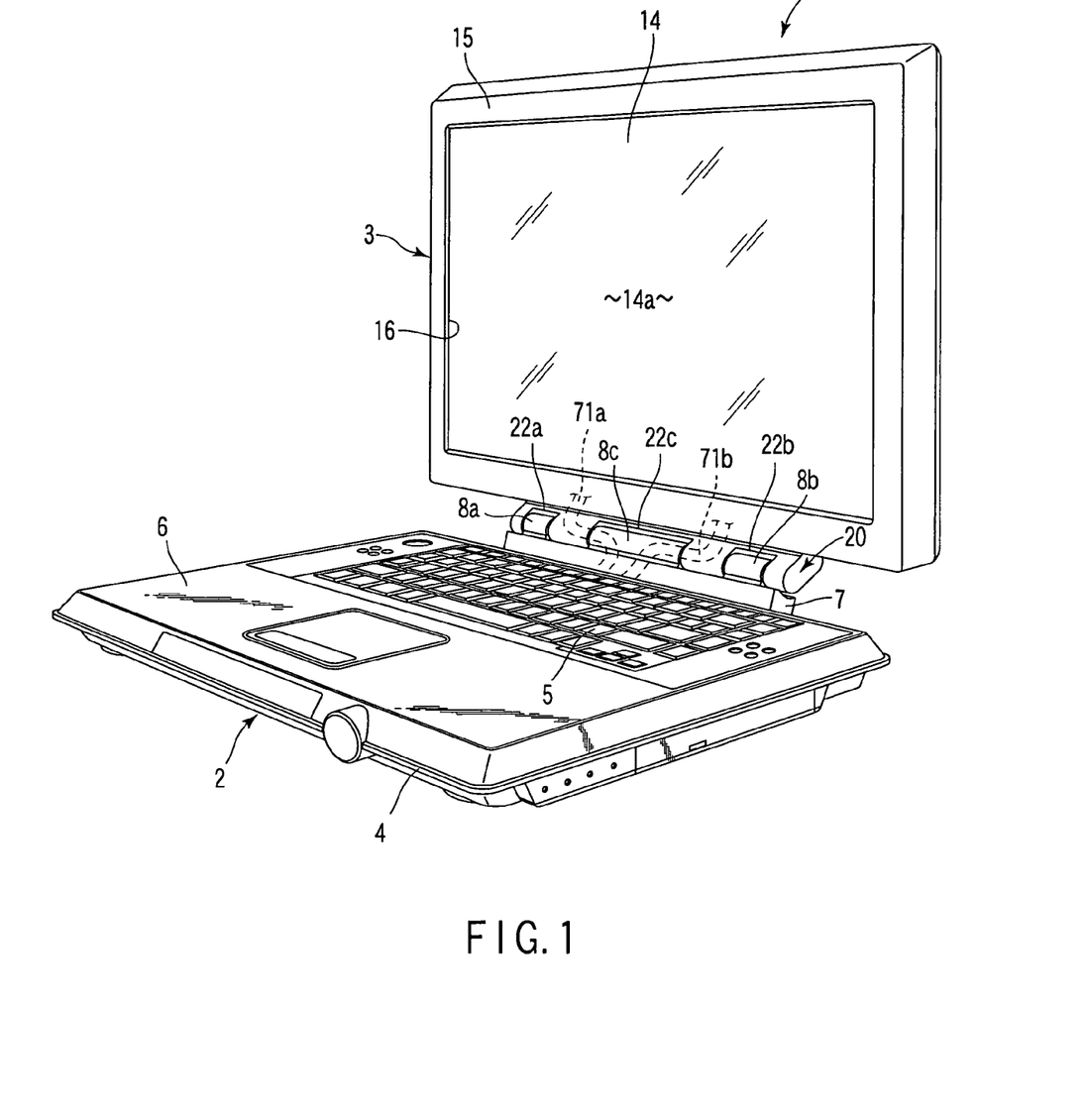
FIG. 1 is a perspective view of an exemplary portable computer according to an embodiment of this invention, showing the display unit rotated to the second position.
Figure 6:
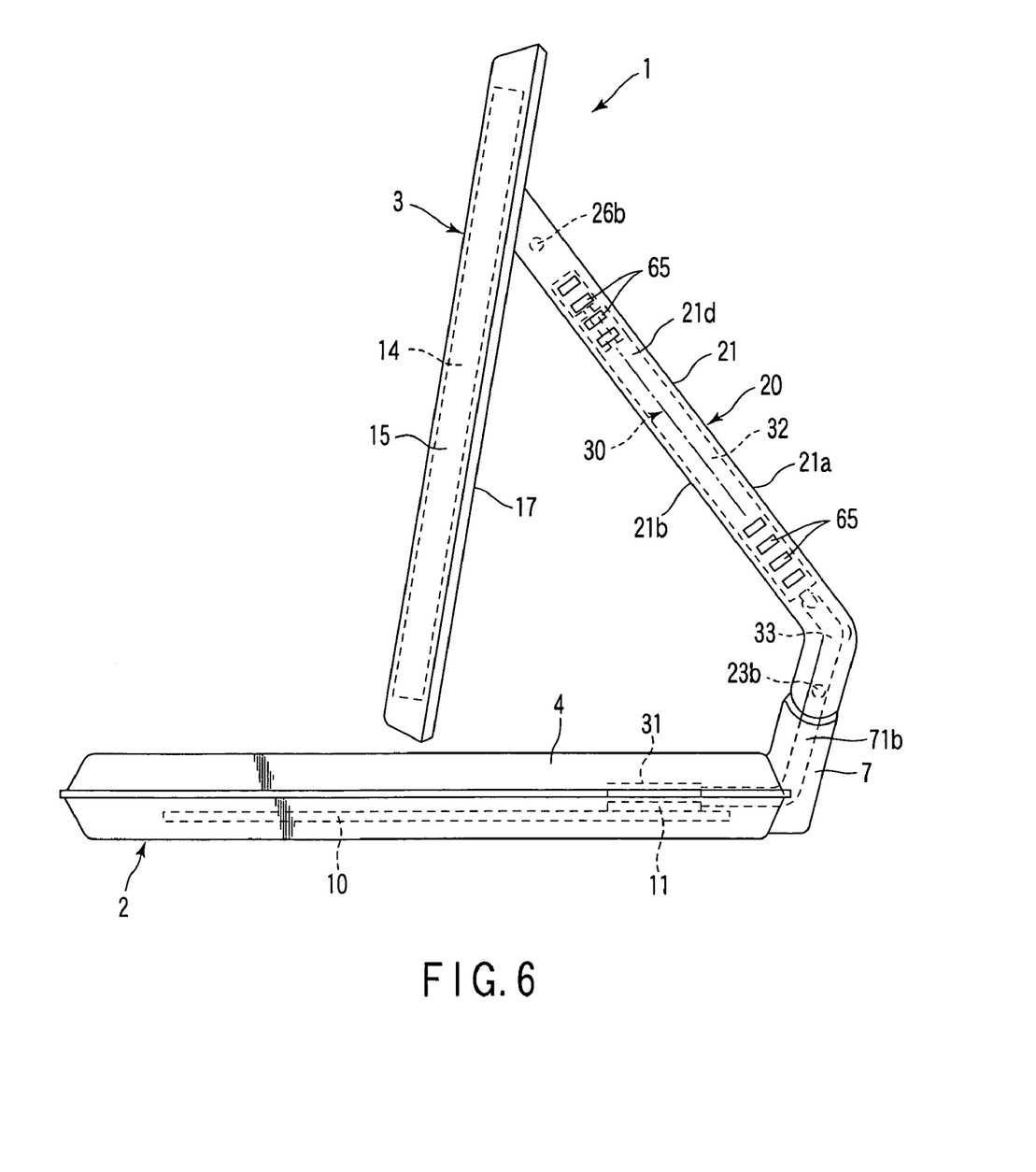
FIG. 6 is a side view of the portable computer of FIG. 1, illustrating the positional relation the display unit has with the support unit when it is moved to the third position.
Figure 8:
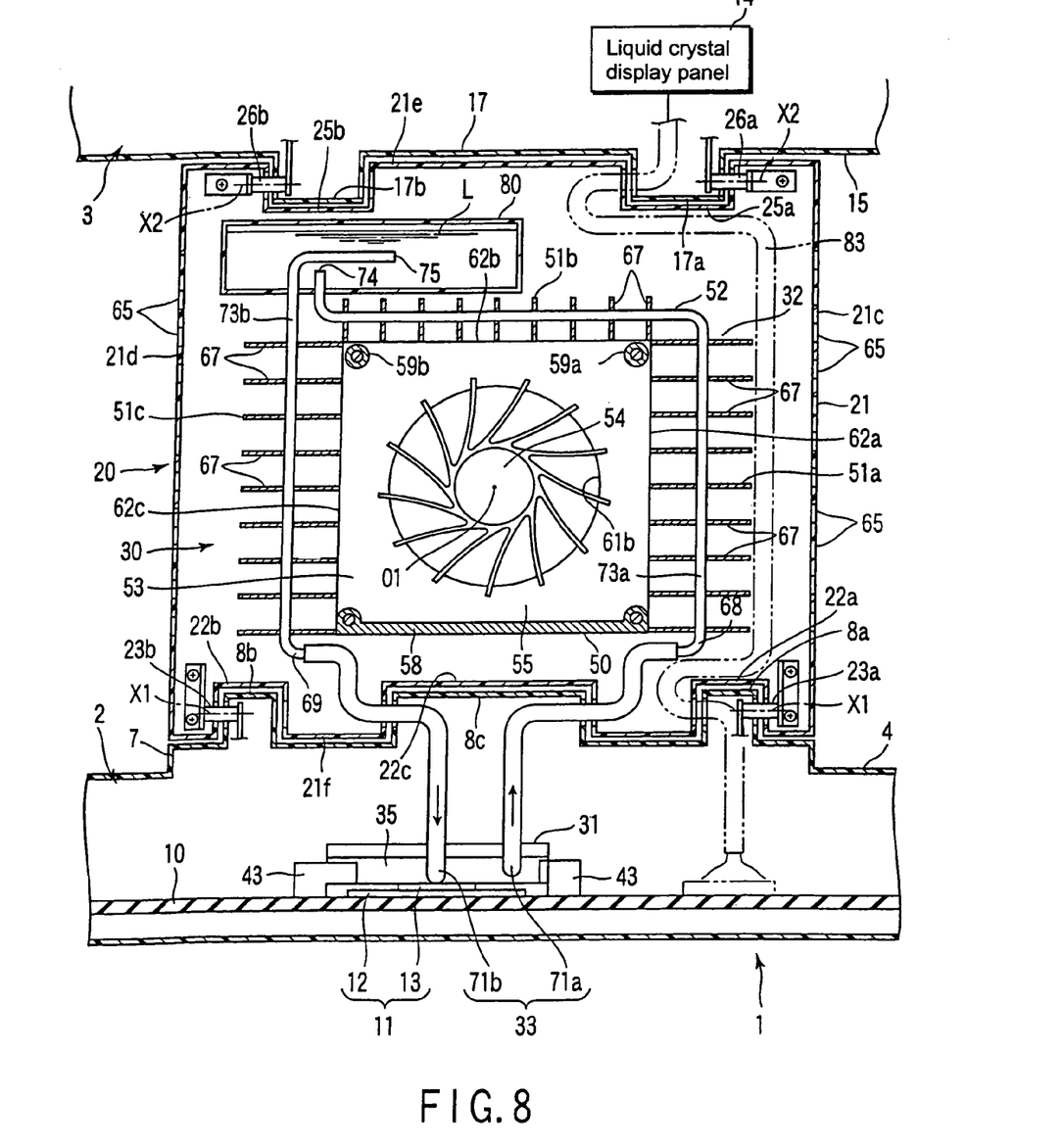
FIG. 8 is a sectional view of the portable computer, illustrating the positional relation between the heat-receiving portion provided in the main unit, the heat-radiating portion provided in the support unit and the circulation path for circulating liquid coolant between the heat-receiving and heat-radiating headers.

As illustrated in FIGS. 1, 6 and 8, the first housing 4 contains a printed circuit board 10. The printed circuit board 10 has a CPU 11 on its upper surface. The CPU 11, which is a heat-generating component deployed within a BGA-type semiconductor package for example. Located in the rear part of the first housing 4, the CPU 11 has a base substrate 12 and an IC chip 13. The IC chip 13 is mounted on the center part of the base substrate 12. In general, the amount of heat produced by the CPU 11 is correlated to its operational speed. Therefore, the IC chip 13 should be cooled to maintain operational stability.

The display unit 3 is an independent component, separated from the main unit 2. The display unit 3 comprises a display device (e.g., liquid crystal display panel) 14 and a second housing 15. The liquid crystal display panel 14, or any other type of display device, has a screen 14a that displays images. The second housing 15 is shaped like a flat box and has almost the same size as the first housing 4. The second housing 15 contains the liquid crystal display panel 14. It has a rectangular opening 16 in its front. Through the opening 16, the screen 14a of the liquid crystal display panel 14 is exposed outside the second housing 15.

Figure 2:
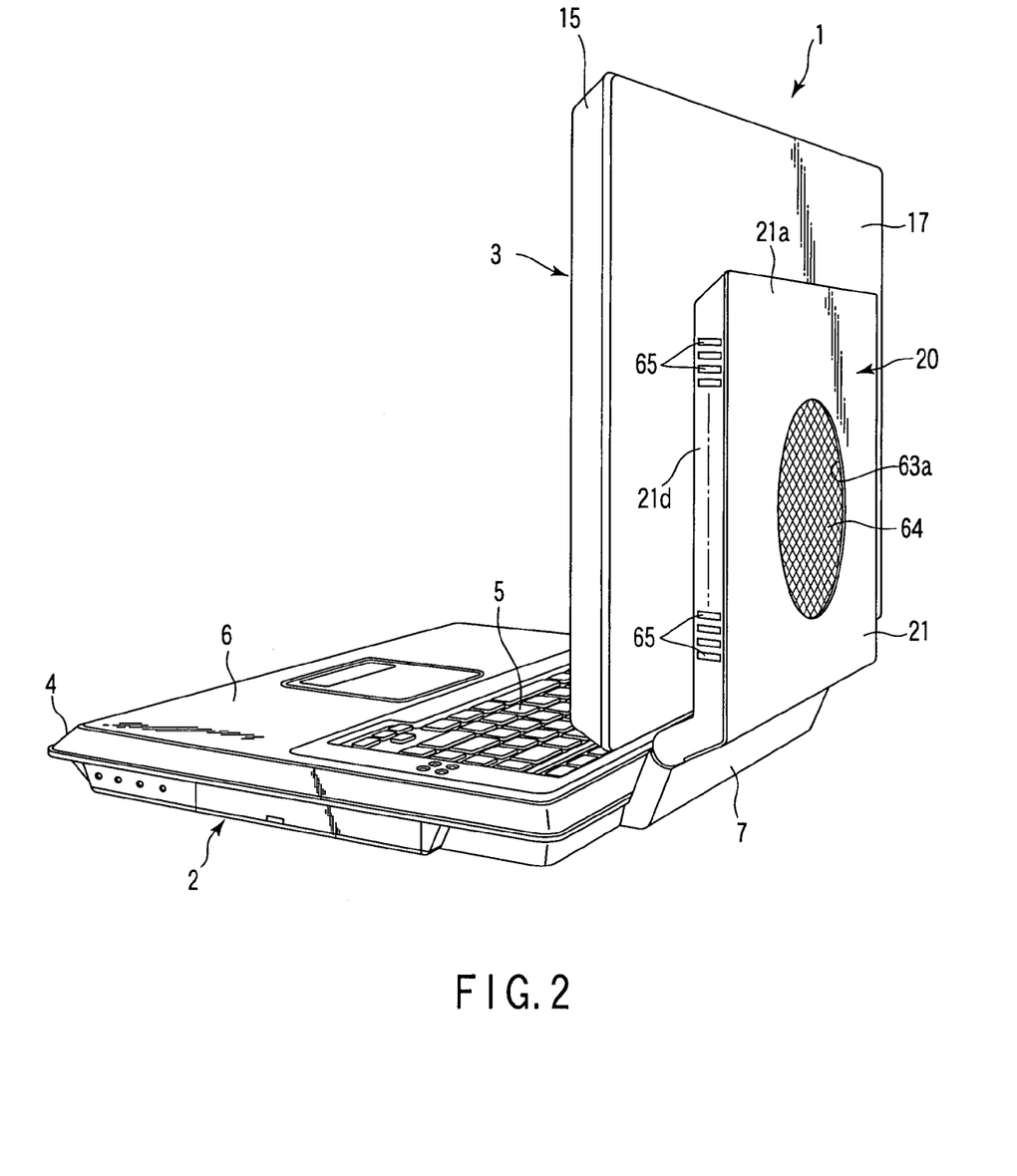
FIG. 2 is a perspective view of the portable computer of FIG. 1, depicting the positional relation the display unit has with the support unit when it is rotated to the second position.
Figure 3:
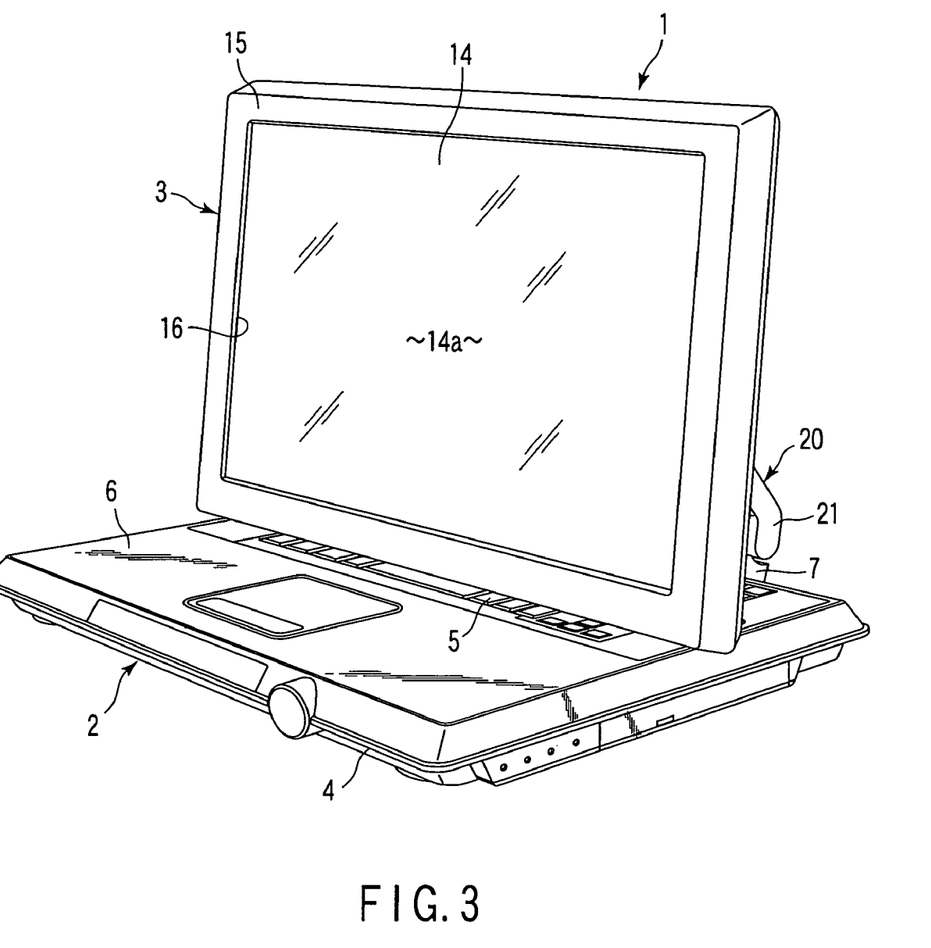
FIG. 3 is a perspective view of the portable computer of FIG. 1, showing the display unit rotated to the third position.

As FIGS. 2 and 6 depicts, the second housing 15 has a back plate 17. The back plate 17 is provided on the back of the liquid crystal display panel 14. As FIG. 8 shows, the back plate 17 has a pair of hollow parts 17a and 17b. Both hollow parts 17a and 17b lie at a level higher than the midpoint of the second housing 15. They are spaced apart in the widthwise direction of the second housing 15 and project toward the back of the second housing 15.

As is illustrated in FIGS. 4 to 8, the portable computer 1 has a support unit 20. The support unit 20 has a third housing 21. The third housing 21 is shaped like a flat box, comprising a top wall 21a, a bottom wall 21b, left and right side walls 21c and 21d, and a pair of end walls 21e and 21f. The top wall 21a and the bottom wall 21b are opposite of each other. The side walls 21c and 21d and the end walls 21e and 21f connect the four edges of the top wall 21a to the corresponding edges of the bottom wall 21b. Therefore, at least one edge forming end wall 21e of support 20 is coupled to display unit 3 while another edge forming end wall 21f is coupled to main unit 2, such as the coupling seat 7 of main unit for example. The third housing 21 has a smaller width than the first and second housings 4 and 15.

Figure 7:
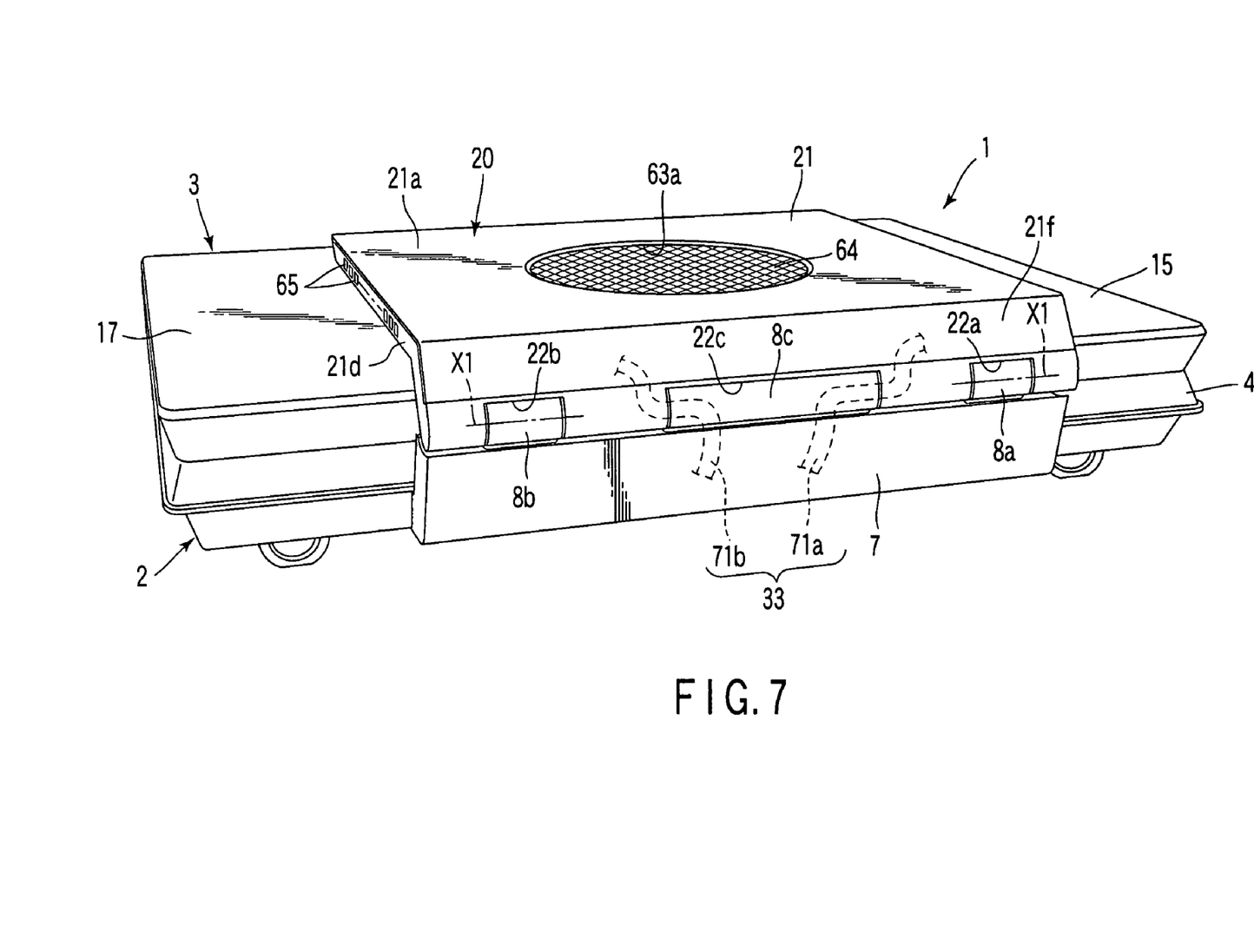
FIG. 7 is a perspective view of the portable computer of FIG. 1, showing the display unit rotated to the first position.

As seen from FIGS. 7 and 8, one horizontal edge of the third housing 21 has three recesses 22a, 22b and 22c. The first and second recesses 22a and 22b are spaced apart in the widthwise direction of the third housing 21 and aligned with the first and second hollow projections 8a and 8b, respectively. The first and second hollow projections 8a and 8b protrude into the first and second recesses 22a and 22b. The third recess 22c lies between the first and second recesses 22a and 22b, aligned with the third hollow projection 8c. The third hollow projection 8c protrudes into the third recess 22c.

A pair of first hinges 23a and 23b couple the horizontal edge of the third housing 21 to the coupling seat 7 of the first housing 4. One of the first hinges, 23a, extends between the first hollow projection 8a of the seat 7 and the third housing 21. The other first hinge 23b extends between the second hollow projection 8b of the seat 7 and the third housing 21. The first hinges 23a and 23b have a common horizontal axis X1 that extends in the widthwise direction of the first housing 4. The horizontal edge of the third housing 21 can rotate around the axis X1 with respect to the coupling seat 7 of the first housing 4.

As FIG. 8 shows, the other horizontal edge of the third housing 21 has two recesses 25a and 25b. These recesses 25a and 25b are spaced in the widthwise direction of the third housing 21 and aligned with the hollow projections 17a and 17b of the second housing 15. The hollow projections 17a and 17b protrude into the recesses 25a and 25b.

A pair of second hinges 26a and 26b couple the other horizontal edge of the third housing 21 to the back plate 17 of the second housing 15. One of the second hinges, 26a, extends between the hollow projection 17a of the second housing 15 and the third housing 21. The other second hinge 26b extends between the hollow projection 17b of the second housing 15 and the third housing 21. The second hinges 26a and 26b have a common horizontal axis X2 that extends in the widthwise direction of the third housing 21.

The other horizontal edge of the third housing 21 can rotate around the axis X2 with respect to the back plate 17 of the second housing 15.

That is, the third housing 21 can rotate between a position where it overlaps the back plate 17 of the second housing 15 and a position where it is remote from the back plate 17. The third housing 21 can be held at these positions, owing to the braking forces of the second hinges 26a and 26b.

Thus, the support unit 20 couples the display unit 3 to the main unit 20 allowing the display unit 3 to rotate independently of the support unit 20. More specifically, the display unit 3 can rotate between the first and second positions, while overlapping the support unit 20. FIG. 7 shows the display unit 3 rotated to the first position. As seen from FIG. 7, the display unit 3 lies on the main unit 2, covering the keyboard 5 and palm rest 6 from above, as long as it remains at the first position. FIG. 1 shows the display unit 3 rotated to the second position. At the second position, the display unit 3 stands upright at the rear edge of the main unit 2, exposing the keyboard 5, palm rest 6 and screen 14a.

The user of the computer 1 may rotate the display unit 3 upwards to any position between the first and second position. In this case, the back plate 17 of the second housing 15 moves away from the support unit 20. As a result, the display unit 3 moves to a third position as is illustrated in FIG. 6. At the third position, the display unit 3 stands up, more forwards a little than at the second position. Thus, the display unit 3 can be moved in a generally lateral direction over the main unit 2 by changing the angle at which the support unit 20 stands. The support unit generally remains in a raised orientation at the back of the display unit 3 when in the second or third positions. Once the display unit 3 has reached the third position, the housing of the support unit 20, i.e., third housing 21, gradually inclines upwards as it moves forward from the rear edge of the first housing 4.

Figure 4:
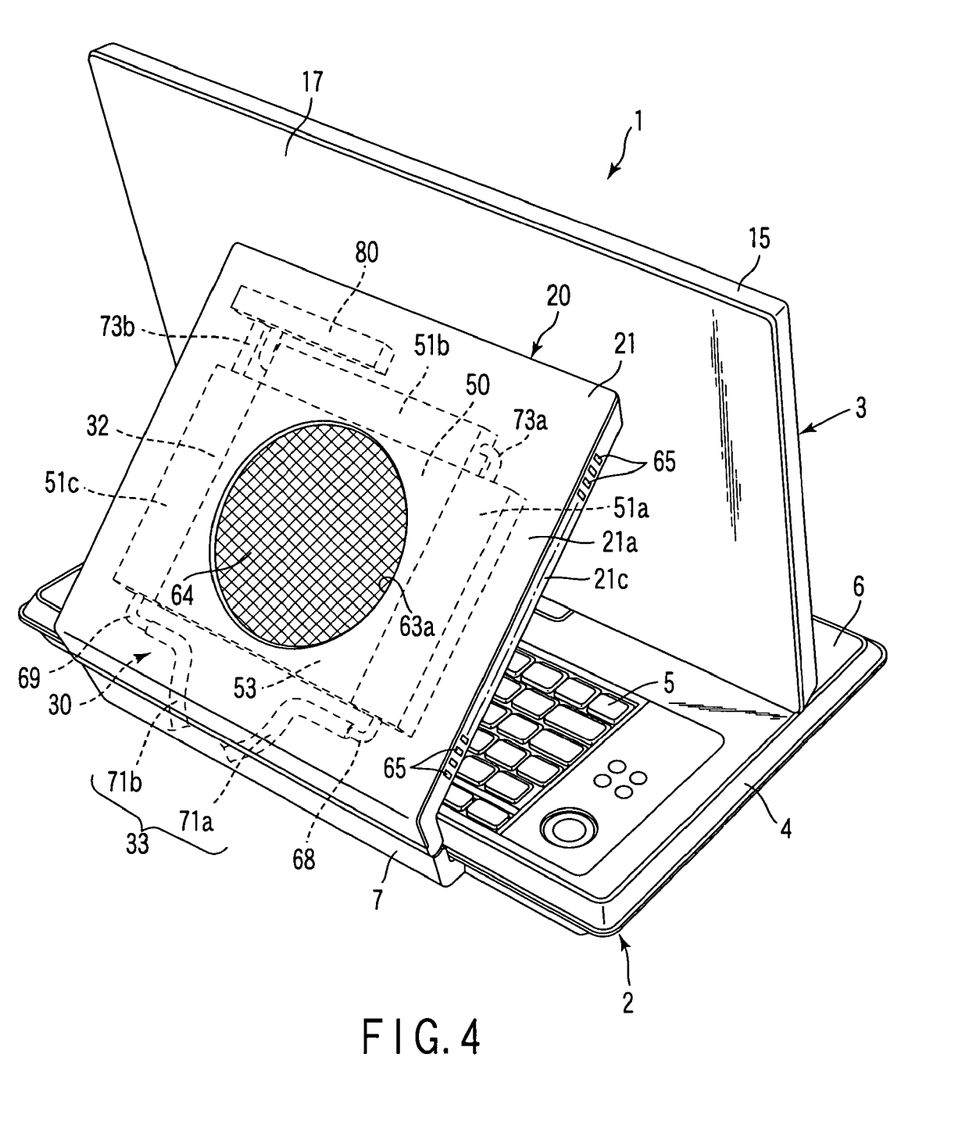
FIG. 4 is a perspective view of the portable computer of FIG. 1, depicting the positional relation the display unit has with the support unit while it is rotated to the third position.

As is depicted in FIGS. 4 and 8, the portable computer 1 incorporates a cooling unit 30 that is designed to cool the CPU 11 with liquid coolant.

The cooling unit 30 comprises a rotary pump 31, a heat-radiating portion 32, and a circulation path 33.

Figure 10:
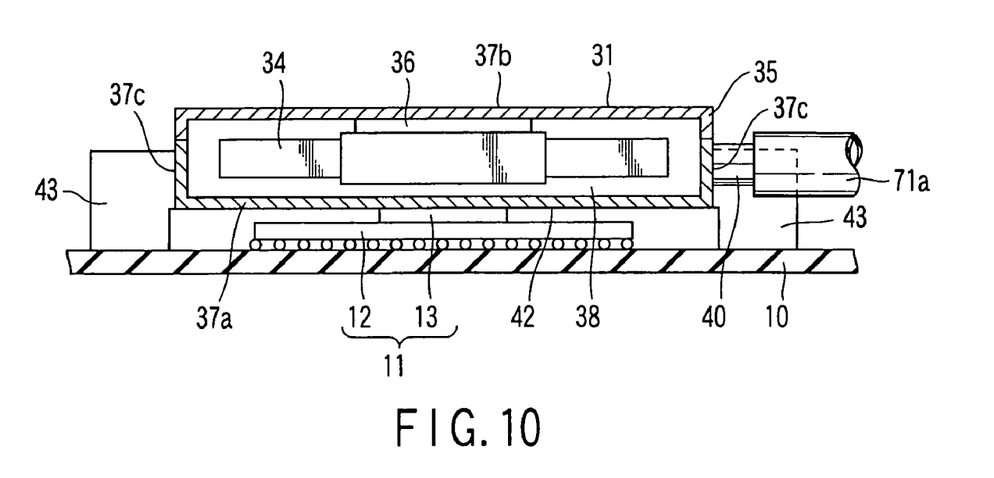
FIG. 10 is a sectional view representing the positional relation that the rotary pump and the CPU have in the portable computer.

The rotary pump 31 functions as heat-receiving portion as well, to receiving the heat that the CPU 11 generates while operating. The pump 31 is provided in the first housing 4 and mounted on the upper surface of the printed circuit board 10. As FIG. 10 shows, the rotary pump 31 comprises an impeller 34, a pump housing 35 and a flat motor 36. The flat motor 36 starts driving the impeller 34 when the power switch on the portable computer 1 is turned on or when the temperature of the CPU 11 rises to a preset thermal threshold value.

The pump housing 35 contains the impeller 34. The pump housing 35 is shaped like a flat box and larger than the CPU 11. It is made of material excelling in thermal conductivity, such as aluminum alloy. The pump housing 35 has a bottom wall 37a, a top wall 37b, and four side walls 37c. The walls 37a, 37b and 37c define a pump chamber 38, in which the impeller 34 is located. The lower surface of the bottom wall 37a of the pump housing 35 is flat, serving as heat-receiving surface 42. The heat-receiving surface 42 is large, covering the CPU 11 from above.

Figure 9:
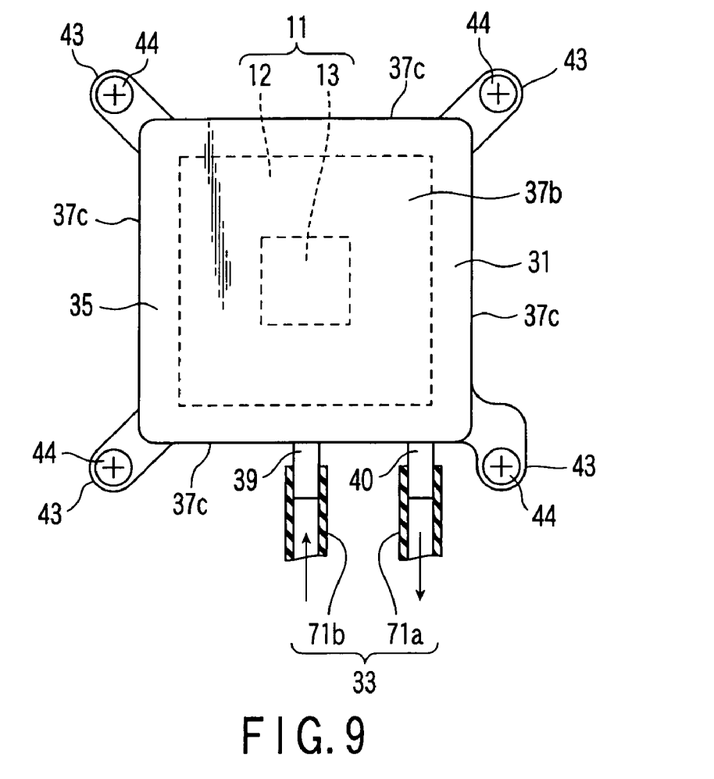
FIG. 9 is a plan view of an exemplary rotary pump incorporated in the portable computer.

As illustrated in FIG. 9, the pump housing 35 has an inlet port 39 and an outlet port 40 The ports 39 and 40 open to the pump chamber 38 and protrude from one of the side walls 37c toward the back of the first housing 4.

The pump housing 35 has four legs 43. The legs 43 are provided at the four corners of the pump housing 34 and project downwards from the heat-receiving surface 42. Screws 44 fasten the legs 43 to the upper surface of the printed circuit board 10. Since the legs 43 are so fastened to the board 10, the pump housing 35 overlaps the CPU 11 and the center part of the heat-receiving surface 42 is thermally coupled to the IC chip 13 of the CPU 11.

Figure 11:
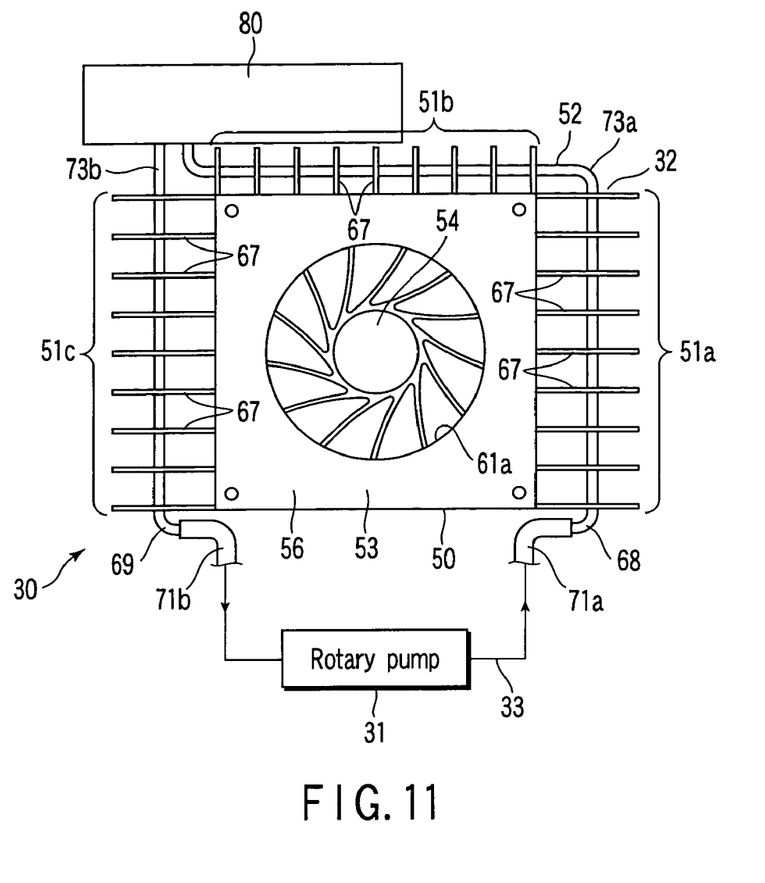
FIG. 11 is a plan view the cooling unit incorporated in the portable computer.
Figure 12:
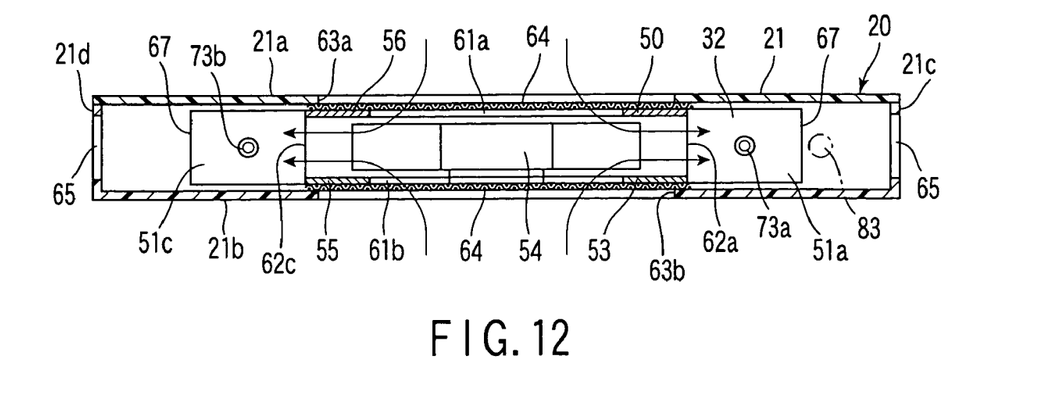
FIG. 12 is a plan view showing an exemplary cooling unit incorporated in the third housing.

The third housing 21 of the support unit 20 contains the heat-radiating portion 32 of the cooling unit 30. As FIGS. 8, 11 and 12 shows, the heat-radiating portion 32 comprises an electric fan 50, first to third heat-radiating blocks 51a, 51b and 51c, and a tube 52.

The electric fan 50 has a fan case 53 and a centrifugal impeller 54. The fan case 53 is made of material with a high thermal conductivity constant, such as aluminum alloy. The fan case 53 comprises a rectangular main part 55 and a cover 56. The main part 55 has a side wall 58 and a pair of bosses 59a and 59b. The side wall 58 rises from one edge of the main part 55. The bosses 59a and 59b are provided at the opposite edge of the main part 55. The cover 56 is secured to the side wall 58 and bosses 59a and 59b and extends between the top of the side wall 58 and the tops of bosses 59a and 59b.

The main part 55 supports the impeller 54, which is interposed between the main part 55 and the cover 56. A flat motor (not shown) starts driving the impeller 54 when the power switch on the portable computer 1 is turned on or when the temperature of the CPU 11 rises to a preset thermal threshold value.

The fan case 53 has two suction ports 61a and 61b and first to third discharge ports 62a, 62b and 62c. The suction ports 61a and 61b are made, each in the cover 56 and the main part 55. They oppose each other, across the impeller 54.

As seen from FIG. 8, the first discharge port 62a lies between one boss 59a, on the one hand, and the side wall 58 of the main part 55, on the other. The second discharge port 62b lies between the bosses 59a and 59b. The third discharge port 62c lies between the one boss 59b, on the one hand, and side wall 58 of the main part 55, on the other. Stated in another way, the first discharge port 62a and the third discharge port 62c are positioned on opposite sides of the impeller 54, and the second discharge port 62b faces the side wall 58 across the impeller 54.

Made in three sides of the fan case 53, the first to third discharge ports 62a, 62b and 62c surround the periphery of the impeller 54. Hence, the discharge ports 62a, 62b and 62c opens in three directions, each extending in three lines that meet at the axis 01 of rotation of the impeller 54. Thus, the ports 62a, 62b and 62c define an elongate opening that extends around the axis 01 through a larger angle of rotation than in the conventional cooling systems.

When the impeller 54 is driven, air flows into the fan case 53 through the suction ports 61a and 61b. In the fan case 53, the air flows to the center part of the impeller 54 and further flows from the periphery of the impeller 54. Finally, the air is expelled from the fan case 53 through the first to third discharge ports 62a, 62b and 62c. Therefore, the cooling air is applied in three directions from the fan case 53 of the electric fan 50.

Figure 13:
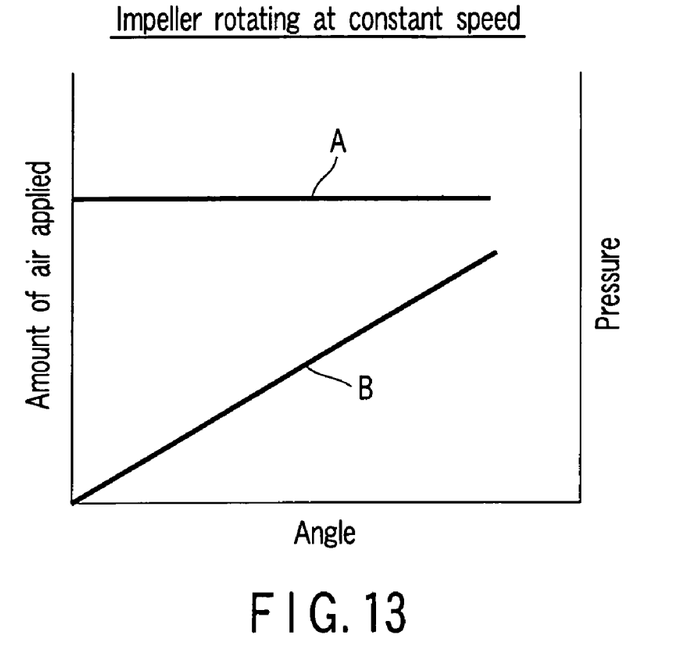
FIG. 13 is a graph showing a relation between the size of the opening of a discharge port and the amount and pressure in and at which cooling air is applied through discharge port, said opening extending around the axis of rotation of an impeller.

FIG. 13 illustrates a relation between the size of the opening of a discharge port and the amount and pressure in and at which cooling air is applied through discharge port, said opening extending around the axis of rotation of an impeller. As line A shows, the pressure at which the cooling air is applied through the discharge port remains unchanged, regardless of the size of the opening of the port. As line B indicates, the amount in which the cooling air is applied through the discharge port increases in proportion to the size of the opening of the port.

As specified above and shown in FIG. 8, the electric fan 50 has three discharge ports 62a, 62b and 62c, which are made in the three sides of the fan case 53. Hence, the fan 50 can apply cooling air through the ports 62a, 62b and 62c in a sufficient amount. For instance, cooling air may be applied in a sufficient amount and at a sufficient pressure when the ports 62a to 62c define an elongate opening extending around the axis 01 of rotation of the impeller 54 through an angle equal to or greater than 190°.

As shown in FIGS. 8 and 12, screws fasten the fan case 53 of the electric fan 50 to the bottom wall 21b of the third housing 21. The top wall 21a and bottom wall 21b of the third housing 21 have intake ports 63a and 63b, respectively. The intake ports 63a and 63b oppose the suction ports 61a and 61b of the fan case 53 and have a larger opening than the suction ports 61aand 61b. Two mesh guards 64 cover the intake ports 63a and 63b, respectively, to prevent foreign matter, such as clips, from entering the intake ports 63a and 63b.

As illustrated in detail in FIG. 8, the first and third discharge ports 62a and 62c of the fan case 53 oppose the side walls 21c and 21d of the third housing 21, respectively. The second discharge port 62b of the fan case 53 opposes the end wall 21e of the third housing 21. The side walls 21c and 21d of the third housing 21 have a plurality of exhaust ports 65. The exhaust ports 65 are arranged in a row, each spaced apart from another, and located at the back of the display unit 3.

The first to third heat-radiating blocks 51a, 51b and 51c are provided, respectively, in the first to third discharge ports 62a, 62b and 62c of the fan case 53. The blocks 51a, 51b and 51c have heat-radiating fins 67 each. The fins 67 are shaped like a flat plate. The fins 67 are made of metal that excels in thermal conductivity, such as aluminum alloy. The heat-radiating fins 67 are arranged are spaced apart, extending parallel to one another. The fins 67 are secured to the rims of the first to third discharge ports 62a, 62b and 62c of the fan case 53. The heat-radiating fins 67 of the first to third heat-radiating blocks 51a, 51b and 51c oppose the exhaust ports 65 of the third housing 21.

The first to third heat-radiating blocks 51a, 51b and 51c are arranged, surrounding the impeller 54 of the electric fan 50 at three sides of the fan case 53. The cooling air discharged through the first to third discharge ports 62a, 62b and 62c flows, passing through the gaps between the heat-radiating fins 67 of the first to third heat-radiating blocks 51a, 51b and 51c.

The tube 52 of the heat-radiating portion 32 is made of metal that excels in thermal conductivity, such as aluminum alloy. As seen from FIGS. 8 and 11, the tube 52 extends through the center parts of the heat-radiating fins 67 of the first to third heat-radiating blocks 51a, 51b and 51c and is thermally connected to the heat-radiating fins 67. The tube 52 has a coolant inlet port 68 and a coolant outlet port 69. The ports 68 and 69 are located near the junction between the first housing 4 and the third housing 21.

As FIGS. 8-12 depict, the circulation path 33 of the cooling unit 30 have two connection tubes 71a and 71b. The first connection tube 71a connects the outlet port 40 of the rotary pump 31 and the coolant inlet port 68 of the heat-radiating portion 32. The first connection tube 71a first extends from the rotary pump 31 to the third hollow projection 8c of the first housing 4, then passes through the junction between the projection 8c and the third housing 21, and further extends into the coolant inlet port 68 of the heat-radiating portion 32.

The second connection tube 71b connects the inlet port 39 of the rotary pump 31 and the coolant outlet port 69 of the heat-radiating portion 32. The second connection tube 71b first extends from the rotary pump 31 to the third hollow projection 8c of the first housing 4, then passes through the junction between the projection 8c and the third housing 21, and finally extends into the coolant outlet port 69 of the heat-radiating portion 32.

The first and second connection tubes 71a and 71b are flexible, both made of rubber or synthetic resin. Therefore, they can deform to absorb the twisting of the circulation path 33, which takes place when the positional relation between the rotary pump 31 and the heat-radiating portion 32 changes as the third housing 21 is rotated.

The liquid coolant fills the pump chamber 38 of the rotary pump 31, the tube 52 of the heat-radiating portion 32, and the circulation path 33. The liquid coolant is, for example, an antifreeze liquid prepared by adding ethylene glycol solution and, if necessary, corrosion inhibitor to water. The liquid coolant absorbs heat from the IC chip 13 as it flows in the pump chamber 38 of the rotary pump 31. Thus, the liquid coolant acts as a medium that transfers the heat of the IC chip 13 to the heat-radiating portion 32 in the present embodiment.

As illustrated in FIGS. 8 and 11, the tube 52 of the heat-radiating portion 32 is composed of an upstream tube 73a and a downstream tube 73b. The upstream tube 73a comprises the coolant inlet port 68 at one end and an outlet port 74 at the other end. The upstream tube 73a is bent in the form of L, passing through the heat-radiating fins 67 of the first heat-radiating block 51a and through the heat-radiating fins 67 of the second heat-radiating block 51b. The downstream tube 73b comprises the coolant outlet port 69 at one end and an inlet port 75 at the other end. The downstream tube 73b extends substantially straight, passing through the heat-radiating fins 67 of the third heat-radiating block 51c.

A reserve tank 80 is provided between the upstream tube 73a and the downstream tube 73b, to temporarily contain the liquid coolant. The reserve tank 80 is incorporated in the third housing 21 and located between the second heat-radiating block 51b of the heat-radiating portion 32 and the end wall 21f of the third housing 21. According to one embodiment, the tank 80 is rectangular shaped like a flat box, generally extending in the widthwise direction of the third housing 21. The reserve tank 80 is secured to the bottom wall 21b of the third housing 21 or the heat-radiating portion 32.

Figure 14:
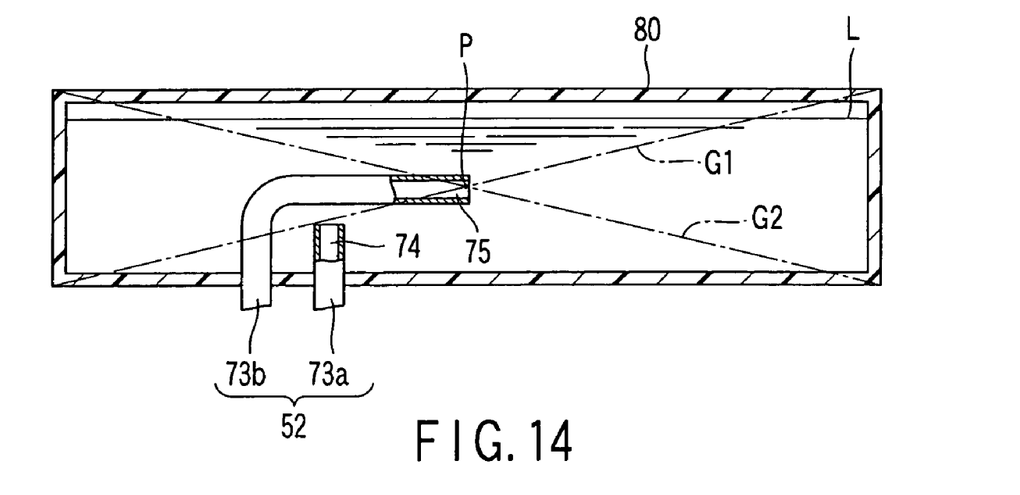
FIG. 14 is a sectional view of the reserve tank provided in the portable computer according to the embodiment of this invention.

The outlet port 74 of the upstream tube 73a and the inlet port 75 of the downstream tube 73b open to the interior of the reserve tank 80. Thus, the liquid coolant contained in the reserve tank 80 can flow into the inlet port 75 of the downstream tube 73b. The inlet port 75 of the downstream tube 73b is positioned at the center part of the reserve tank 80. Hence, as shown in FIG. 14, the inlet port 75 of the downstream tube 73b is located near the intersection P of two diagonals G1 and G2, each connecting the opposite corners of the tank 80. The inlet port 75 therefore lies below the surface level L of the liquid coolant stored in the reserve tank 80 and remains immersed in the liquid coolant.

As FIG. 8 shows, the liquid crystal display panel 14 provided in the second housing 15 is electrically connected by a cable 83 to the printed circuit board 10 incorporated in the first housing 4. The cable 83 extends from the liquid crystal display panel 14, passes through the junction between the hollow projection 17a of the second housing 15 and the recess 25a of the third housing 21, and extends into the third housing 21. In the third housing 21, the cable 83 passes between the first heat-radiating block 51a and side wall 21c and extends into the first housing 4 through the junction between the first recess 22a of the third housing 21 and the first hollow projection 8a of the first housing 4.

In summary, as shown in FIGS. 8-12, IC chip 13 of the CPU 11 generates heat while the portable computer 1 is being used. The heat that the IC chip 13 generates is transmitted to the pump housing 35 because the IC chip 13 is thermally connected to the heat-receiving surface 42 of the pump housing 35. The pump housing 35 has the pump chamber 38, which is filled with the liquid coolant. The liquid coolant absorbs most of the heat provided to the pump housing 35 from the IC chip 13.

When the impeller 34 of the rotary pump 31 rotates, the liquid coolant is forced from the pump chamber 38 through the outlet port 40. The coolant flows into the heat-radiating portion 32 through the first connection tube 71a. Thus, the liquid coolant circulates between the pump chamber 38 and the heat-radiating portion 32.

More specifically, the liquid coolant heated by virtue of the heat exchange in the pump chamber 38 is supplied to the upstream tube 73a of the heat-radiating portion 32. The liquid coolant flows through the upstream tube 73a. The coolant heated further flows from the outlet port 74 of the upstream tube 73a into the reserve tank 80. The liquid coolant flowing through the upstream tube 73a may contain bubbles. In this case, the bubbles are removed from the coolant in the reserve tank 80. The liquid coolant that is temporarily stored in the reserve tank 80 is drawn into the inlet port 75 of the downstream tube 73b. The liquid coolant then flows from the downstream tube 73b into the second connection tube 71b.

The upstream tube 73a and downstream tube 73b, in which the liquid coolant flows, are thermally connected to the heat-radiating fins 67 of the first to third heat-radiating blocks 51a, 51b and 51c. The heat of the IC chip 13, absorbed in the liquid coolant, is therefore transmitted to the heat-radiating fins 67 as the liquid coolant flows through the upstream tube 73a and downstream tube 73b.

The first to third heat-radiating blocks 51a, 51b and 51c are located at the three discharge ports 62a, 62b and 62c of the electric fan 50, respectively, and surround the impeller 54 at three sides of the fan case 53. When the impeller 54 rotates, the cooling air discharged via the discharge ports 62a, 62b and 62c passes between the heat-radiating fins 67. The cooling air is then applied to the first and second tubes 73a and 73b. As a result, the cooling air takes away the heat transmitted from the IC chip 13 to the heat-radiating fins 67 and the first and second tubes 73a and 73b.

The liquid coolant is cooled because of the heat exchange performed in the heat-radiating portion 32. The coolant thus cooled flows back into the pump chamber 38 of the rotary pump 31 through the second connection tube 71b. The coolant repeats absorption of the heat of the IC chip 13. It is then supplied to the heat-radiating portion 32. Thus, the liquid coolant transfers the heat of the IC chip 13 to the heat-radiating portion 32. The heat is released outside the portable computer 1, from the heat-radiating portion 32.

Figure 5:
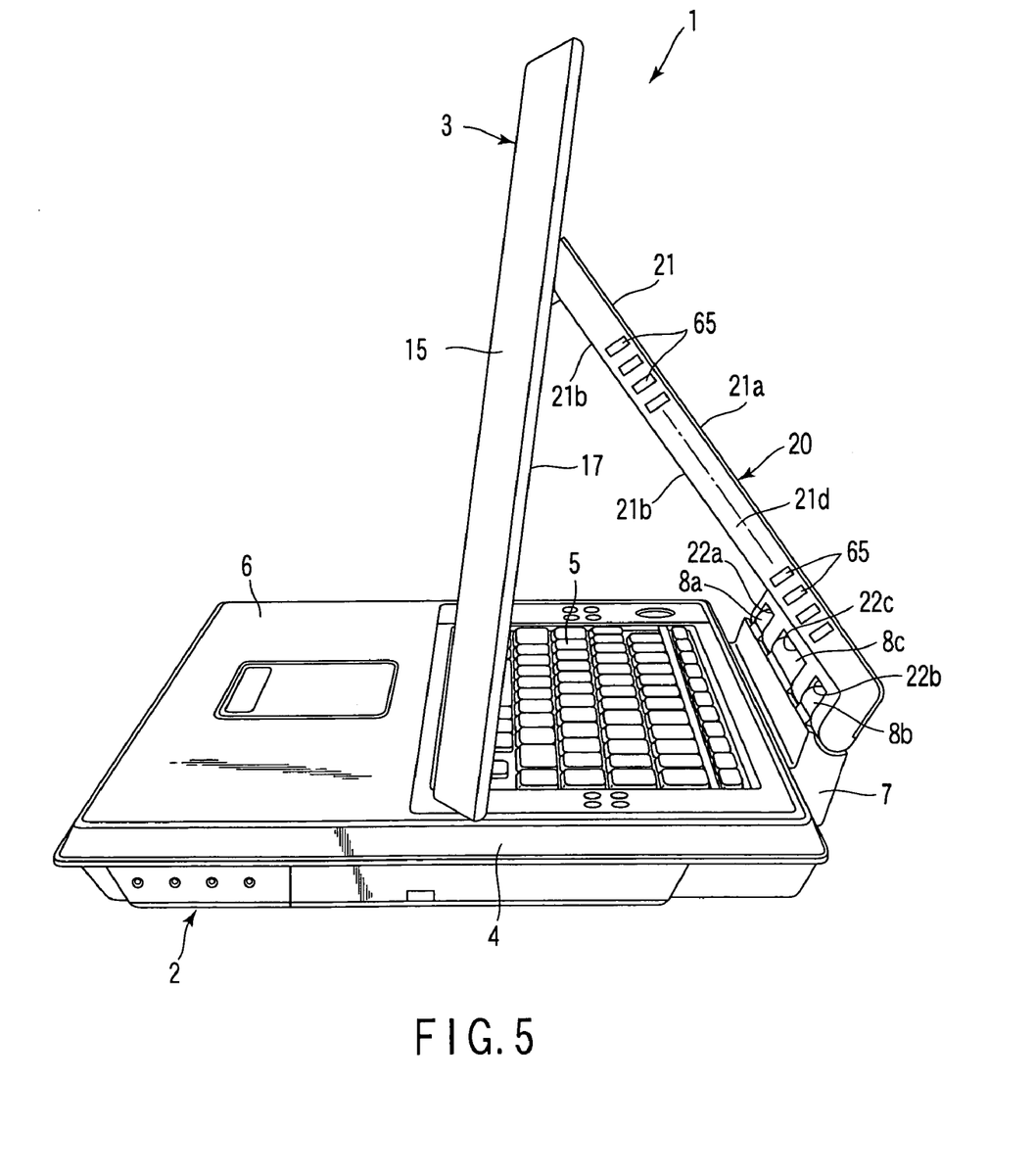
FIG. 5 is a perspective view of the portable computer of FIG. 1, representing the positional relation the display unit has with the support unit when it is moved to the third position.

As shown in FIGS. 4 and 5, for this embodiment of the portable computer 1, the heat-radiating portion 32 is provided in the support unit 20 coupling the display unit 3 to the main unit 2. Namely, the heat-radiating portion 32 is remote from the main unit 2 and the display unit 3. Therefore, the heat released from the heat-radiating portion 32 does not accumulate in either the first housing 4 of the main unit 2 or the second housing 15 of the display unit 2. This controls the increase in the temperature in the first housing 4 and second housing 15.

Hence, the printed circuit board 10 and liquid crystal display panel 14, which are provided in the first and second housing 4 and 15, respectively, experience minor thermal influences. The printed circuit board 10 can be prevented from being deformed, and the liquid crystal display panel 14 is prevented from being degraded in performance.

Further, no space needs to be provided in either the first housing 4 or the second housing 15 to accommodate for the cooling unit 30. This helps to render the first and second housing 4 and 15 thin and small.

With the configuration described above, the third housing 21 having the heat-radiating portion 32 gradually inclines as it is moved forward from the rear edge of the first housing 4 after the display unit 3 has been rotated to the third position. As a result, the back plate 17 of the second housing 15 moves away from the bottom wall 21b of the third housing 21, opening the intake port 63b (FIG. 12) made in the bottom plate 21b. Both intake ports 63a and 63b of the third housing 21 are thereby exposed. Air can therefore flow into the electric fan 50 through the intake ports 63a and 63b.

This increases the amount of air supplied through the discharge ports 62a, 62b and 62c of the electric fan 50 (FIG. 8). The first to third heat-radiating blocks 51a, 51b and 51c can therefore be cooled with the cooling air at high efficiency.

In addition, according to this embodiment of the invention, the third housing 21 of the support unit 20 solely supports the display unit 2. Thus, a greater part of the third housing 21 provides a space for accommodating the cooling unit 30. Therefore, the electric fan 50 can be a large one that excels in air-supplying ability, and first to third heat-radiating blocks 51a, 51b and 51c can be large enough to increase the heat-radiating area of each fin 67 (FIG. 8). This can enhance the efficiency of cooling the CPU 11 and ultimately achieves more reliable cooling of the CPU 11.

The present invention is not limited to the embodiment described above. Various changes and modifications can be made, without departing from the scope and spirit of the invention. For example, a heat-receiving portion may be provided, independently of the rotary pump, though the rotary pump 31 functions as heat-receiving portion as well in the above-described embodiment.

Furthermore, the medium for transferring heat is not limited to a liquid that circulates between the heat-receiving portion and the heat-radiating portion. Moreover, at least one heat pipe, for example, may transfer the heat of the heat-generating component directly to the heat-radiating portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. An electronic apparatus comprising:
   a first housing containing a heat-generating component and a rotary pump;
   a second housing separated from the first housing, the second housing containing a display device;
   a third housing induding a first edge and a second edge, the first edge being rotatably coupled to the first housing, and the second edge being rotatably coupled to the second housing, wherein, the third housing comprises (i) a tube to convey a medium from the rotary pump and (ii) a plurality of fins coupled to the tube to radiate heat from the medium circulated through the third housing and returned back to the first housing.

2. The electronic apparatus according to claim 1, wherein the third housing further comprises a fan to circulate air over the tube and the plurality of fins.

3. The electronic apparatus according to claim 1, wherein the third housing includes an intake port which guides the air to the fan and an exhaust port over which the heat of the heat-generating component is released.

4. The electronic apparatus according to claim 1, wherein the third housing contains the tube and the fins.

5. An electronic apparatus comprising:
a main unit including a heat-generating component and a beat-receiving portion thermally connected to the heat-generating component;
a support unit, having one edge coupled to the main unit and another edge located opposite to the one edge, the support unit including (i) a top wall having a first intake port, (ii) a bottom wall having a second intake port, and (iii) a pair of side wails having exhaust ports, the first and second intake ports being opposed to each other and the exhaust ports opening to a different direction from the first and second intake ports;
a heat-radiating portion contained in the support unit, the heat-radiating portion radiating heat from the heat-generating component through a medium, the heat being conveyed to the medium. at the heat-receiving portion; and
a display unit having a display device, the display unit being coupled to the another edge of the support unit, wherein the heat radiating portion includes a tube in which the medium heated by the heat-receiving portion flows and a fan to draw in cooling air from the first and second intake ports and also to discharge the drawn cooling air to the exhaust ports, the tube being arranged between the fan and the exhaust ports.

6. The electronic apparatus according to claim 5, wherein the fan is located between the first intake port and the second intake port.

7. The electronic apparatus according to claim 5, wherein the display unit is movable between a first position where the display unit covers the main unit from above, a second position where the display unit is supported in an upright orientation, and a third potion where the display unit lies closer to the front of the main unit than at the second position, the support unit is in a raised orientation at the back of the display unit while the display unit remains at either the second position or the third position.

8. The electronic apparatus according to claim 7, wherein the support unit inclines forward from the rear edge of the main unit and the first and second intake ports of the support unit are exposed while the display unit is in the third position.

9. The electronic apparatus according to claim 7, wherein when the display unit is in the second position, the second intake port of the support unit is covered with the display unit and the first intake port of the support unit is exposed.

* * * * *